United States Patent [19]

Hirao et al.

[11] Patent Number: 4,591,736
[45] Date of Patent: May 27, 1986

[54] PULSE SIGNAL AMPLITUDE STORAGE-HOLDING APPARATUS

[75] Inventors: Yoshiaki Hirao, Kashihara; Yoshitomi Nagaoka, Neyagawa, both of Japan

[73] Assignee: Matsushita Electric Industrial Co., Ltd., Osaka, Japan

[21] Appl. No.: 450,102

[22] Filed: Dec. 15, 1982

[30] Foreign Application Priority Data

Dec. 16, 1981 [JP] Japan ................... 56-204410

[51] Int. Cl.⁴ ..................... H03K 5/04; H03K 5/153
[52] U.S. Cl. ........................ 307/267; 307/351; 307/353; 328/151
[58] Field of Search ............... 307/351, 353, 267; 328/58, 151, 162

[56] References Cited

U.S. PATENT DOCUMENTS 3,251,053  5/1966  Doong ................... 328/58

Primary Examiner—John Zazworsky
Attorney, Agent, or Firm—Wenderoth, Lind & Ponack

[57] ABSTRACT

A pulse signal amplitude storage-holding apparatus utilizes a plurality of series connected storage-holding circuits which store and hold the pulse magnitude of an electrical pulse signal whose amplitude is to be stored. At least one electrical pulse signal amplitude compensating circuit may be added to compensate for a storage error with respect to the pulse magnitude of the electrical pulse signal caused by the charge and discharged characteristics of each of the storage-holding circuits. In the alternative, at least one of the storage-holding circuits may be arranged so as to output an output signal accompanied by an overshoot of a fixed amount with respect to the input pulse signal, the overshoot thereby compensating for the abovenoted storage error.

4 Claims, 11 Drawing Figures

PULSE SIGNAL AMPLITUDE STORAGE-HOLDING APPARATUS

BACKGROUND OF THE INVENTION

1. Field of the Invention

This invention relates to an electric pulse signal (to be hereinafter called a pulse signal) computing and processing apparatus, and more particularly to a pulse signal amplitude storage-holding apparatus which is simple in construction and capable of storing and holding for a sufficiently long time the pulse magnitude of a pulse signal in comparison with a pulse width thereof.

2. Description of the Prior Art

A conventional digital processing apparatus which has been used as an apparatus for storing and holding for a long time the pulse magnitude of a pulse signal is shown in a schematic block diagram in FIG. 1, in which the pulse magnitude (the voltage $v_{in}$) of an input electric pulse signal (to be hereinafter called the pulse signal) $V_{in}$ is compared with the preset reference voltage values v1 to vn by a comparison means 2 comprising comparators C1 to Cn, the binary logic output signal from the comparison means 2 is stored in a storage means 3 comprising storage units M1 to Mn comprising flip-flop circuits or the like, and thereafter, a discriminator 4 decides whether or not an output of each of the n-number of storage units M1 to Mn exists, thereby outputting from an output terminal 5 a pulse signal $V_{out}$ of pulse magnitude $v_{out}$ ($=v_{in}$). Such an apparatus decides the resolution of the input pulse signal $V_{in}$ by the division number used for dividing the pulse magnitude of input pulse signal $V_{in}$ into quantized portions. Accordingly, a large division number is required in order to store with sufficiently high accuracy the amplitude level of the pulse signal to be stored, whereby the apparatus becomes large scale.

On the other hand, FIG. 2 is a basic circuit diagram when an analog method is used to store the pulse magnitude of pulse signal by using the pulse signal to charge a capacitor, in which a pulse signal amplitude storage-holding means 6 (to be hereinafter called the storage-holding means) comprises a charging resistance 7 of a resistance value Rc and a storage capacitor 8 of a capacitance value C. The pulse signal $V_{in}$ which is fed into a terminal 9 is used to quickly charge the storage capacitor 8 through the charging resistance 7 so that voltage across the storage capacitor 8 reaches the pulse magnitude $v_{in}$ of pulse signal so as to become constant. Thereafter, the electric charge stored in the storage capacitor 8 is discharged through a load resistance 10 of a resistance value $R_L$ which is connected external to of storage-holding means 6. In addition, in FIG. 2, the waveform of the output signal $V_{out}$ is expanded so as to be sufficiently larger in its pulse width than the input pulse signal $V_{in}$ ($v_{out}=v_{in}$). The storage-holding means 6 is required to have the characteristic that the pulse magnitude $v_{in}$ of the input pulse signal $V_{in}$ is stored in a sufficiently short time in comparison with the pulse width tp thereof, and that the pulse magnitude $v_{in}$ of the pulse signal $V_{in}$ is held for a sufficiently longer time in comparison with the pulse width tp thereof, which is given by the following equation:

$$Rc \cdot C < < tp < < R_L \cdot C \quad (1)$$

Usually, Rc and RL are selected such that $Rc < < RL$, but in the FIG. 2 construction, the equation (1) becomes unsatisfied as the pulse width tp of the input pulse signal $V_{in}$ becomes shorter and the pulse magnitude holding time becomes longer. Hence, a single analog storage-holding means cannot constitute a pulse signal amplitude storage-holding apparatus (to be hereinafter called the pulse amplitude holding apparatus).

SUMMARY OF THE INVENTION

An object of the invention is to provide a pulse amplitude holding apparatus which is based on an analog storage-holding means so as to operate a plurality of storage-holding means connected in series and successively extending the input pulse signal width, so as to thereby store and hold the pulse magnitude of the pulse signal for a sufficiently long time by the use of an apparatus having a relatively simple construction.

The pulse amplitude holding apparatus of the present invention is so constructed that a plurality of storage-holding means for storage-holding the pulse magnitude of the pulse signal by capacitors are connected in series so as to successively extend a holding time for the pulse magnitude of the pulse signal so that the pulse width of the pulse signal is stored in a sufficiently short time and held for a long time with a high accuracy in comparison with the pulse width thereof.

The above and further objects of the invention will more fully appear from the following description in accordance with the accompanying drawings.

DESCRIPTION OF THE PREFERRED EMBODIMENTS

The embodiments of the invention will be detailed in the following description in accordance with the drawings.

Figure 1:
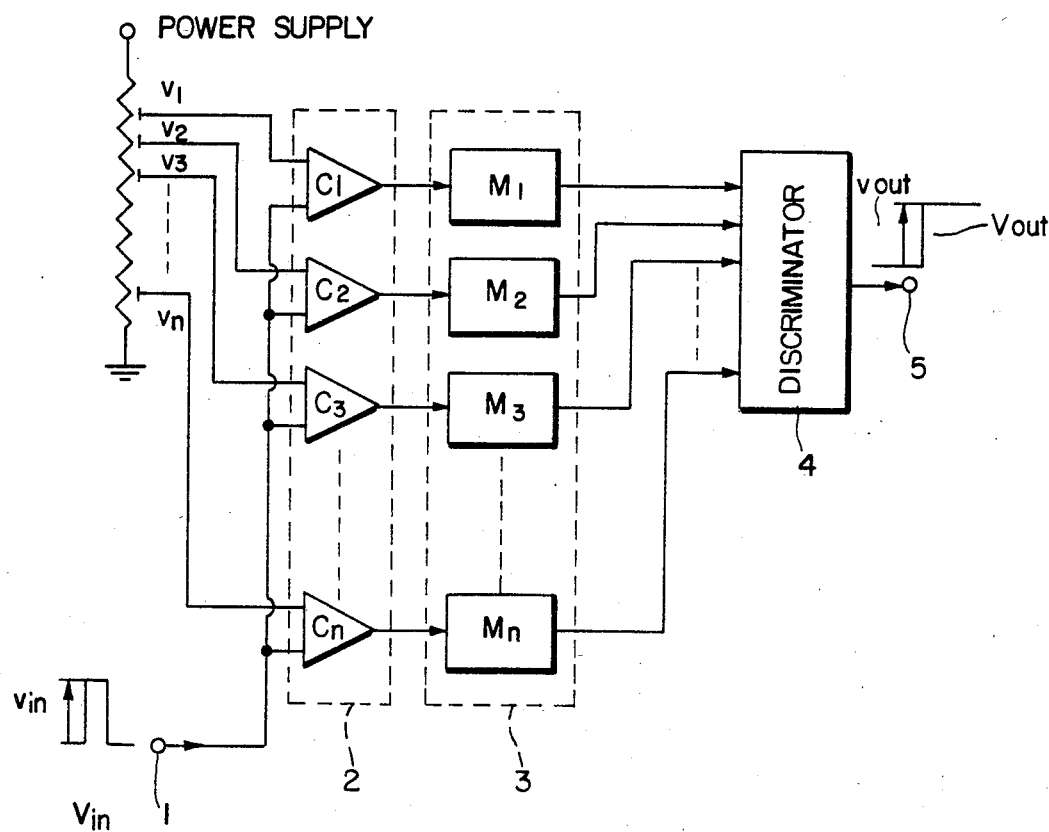
FIG. 1 is a block diagram of a conventional digital pulse amplitude holding apparatus.
Figure 2:
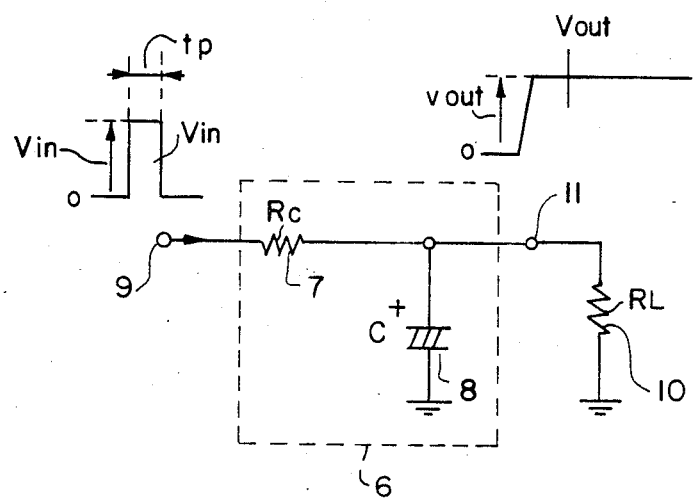
FIG. 2 is a schematic circuit diagram showing the operation principle of a conventional analog storage-holding means.
Figure 3:
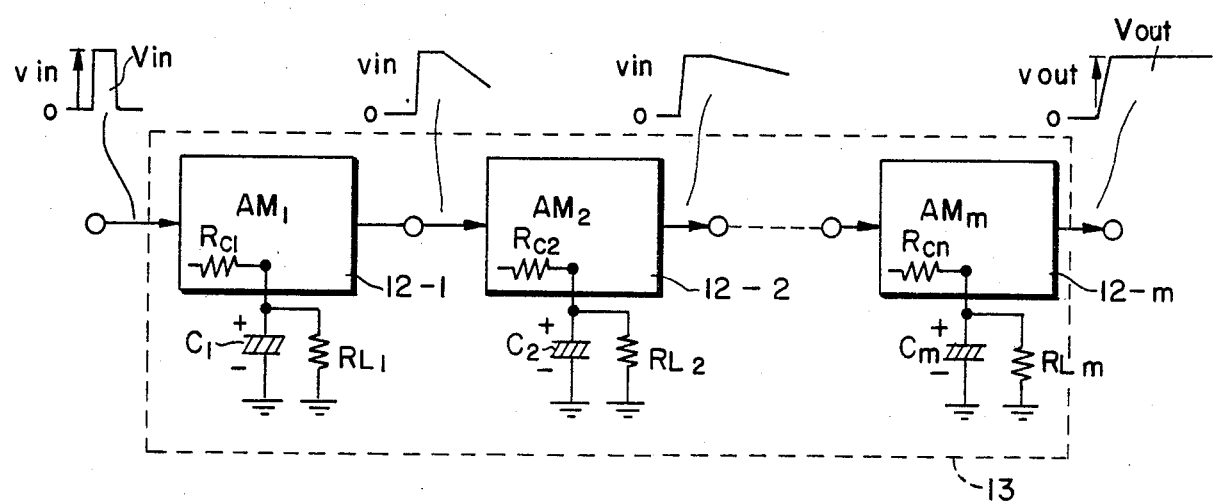
FIG. 3 is a circuit diagram of the principal portion of a first embodiment of the invention.

FIG. 3 is a circuit diagram of the principal portion of a first embodiment of the invention, in which the m-number of storage-holding means AM1, AM2, ... AMm (each designated by 12-1, 12-2, ..., 12-m) include therein storage capacitors C1 to Cm and have the function of respectively successively expanding and outputting the pulse widths of their input pulse signals. References Rc1 to Rcm designate the equivalent input impedance of each storage-holding means 12-1, 12-2, ..., or 12-m, and $R_{L1}$ to $R_{Lm}$ designate the equivalent impedance of the same, each storage-holding means being designed to have the relationship of $Rc1 << R_{L1}, \ldots Rcm << R_{Lm}$.

In the above construction, a first storage-holding means AM1 (12-1) charges the pulse magnitude $v_{in}$ of the input pulse signal $V_{in}$ in a sufficiently short time to the storage capacitor C1 and holds $v_{in}$ while gradually discharging it for a time period decided by C1 and RL1, its output pulse signal value being fed to a second storage-holding means AM2 (12-2). Hereinafter, the same operation is repeated so that the mth storage-holding means outputs an output pulse signal $V_{out}$ ($V_{out} = v_{in}$) sufficiently expanded in its pulse width with respect to the input pulse signal $V_{in}$. The capacitance value of the respective storage capacitors C1 to Cm is selected to quickly complete their charge to the pulse magnitude of the pulse signal in a sufficiently short time in comparison with the pulse width of each input pulse. In a usual case, the following equation holds in the relationship between the capacitance values:

$$C1 < C2 < \ldots < Cm \quad (2)$$

As seen from the above, this embodiment of the invention constructs one pulse amplitude storage-holding apparatus 13 as a whole, comprising a plurality of analog storage-holding means connected in series, thereby making it possible to store the pulse signal magnitude in a sufficiently short time by the use of an apparatus having simple construction and hold it for a long time.

Next, an improved embodiment of the first embodiment will be detailed in accordance with the drawings.

Figure 4:
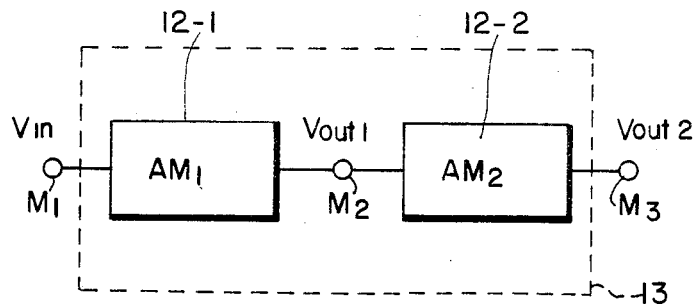
FIGS. 4 and 4A are respectively a block diagram and waveform which are explanatory of the defect in the first embodiment of the invention.
Figure 4A:
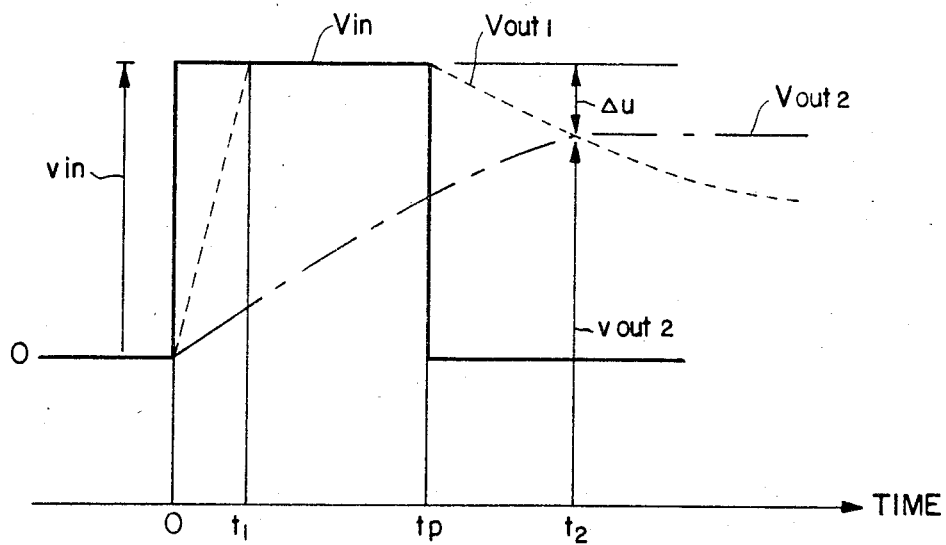

In the first embodiment, a memory error is generated. The error is caused by the charge-discharge characteristic of two adjacent storage-holding means among the plurality of connected storage-holding means constituting the pulse amplitude holding apparatus. In other words, in a case where the output of an optional storage-holding means is fed to a storage-holding means of the next stage for a charging operation, the slower the charging speed of the next stage means is in comparison with that of the optional means, the more the memory error increases. Such a memory error is reducible to a sufficiently small extent so as to not be problematical in practical use when a large number of storage-holding means are provided to gradually perform the storage of the pulse signal magnitude. In fact, however, it is keenly desired to rationalize the circuit by reducing the number of the storage-holding means to the utmost. In this case, a considerably larger memory error may be created due to the design of the charging and discharging speeds of the individual storage-holding means. The above matter will be detailed according to FIGS. 4 and 4A in which the pulse amplitude holding apparatus 13 comprises two storage-holding means. The first storage-holding means AM1 (12-1) is so constructed that when an input pulse signal $V_{in}$ of rectangular waveform formed of the pulse magnitude $v_{in}$ and pulse width tp, is fed into the terminal M1, an internally housed capacitor (not shown) is charged quickly for a time period shorter than the pulse width tp of input pulse signal $V_{in}$ and the pulse magnitude $v_{in}$ is stored, and then a first storage output $V_{out1}$ after the time tp discharging at the predetermined discharge time constant $\tau d_1$ ($\tau d_1 >> tp$) is output at the terminal M2. The second storage-holding means AM2 (12-2), when the storage output $V_{out1}$ of the first storage-holding means AM1 (12-1) is given, immediately starts the charge of the internally-housed capacitor (not shown) to follow the storage output $V_{out1}$ so that the charge reaches a voltage value of storage output $V_{out1}$ at the time $t_2$, and thereafter a second storage output $V_{out2}$ intended to hold the voltage value $V_{out2}$ of the first storage output $V_{out1}$ at the time $t_2$ while discharging at the discharge time constant $\tau d_2$ (set to $\tau d_2 >> \tau d_1$) is output at the terminal M3, where the voltage value $V_{out2}$ if the first storage output $V_{out1}$ is reduced only by $\Delta v$ from the pulse magnitude $v_{in}$ of the input pulse signal during the discharge for the time period $t_2$ to tp at the storage-holding means AM1. Therefore, it is meant that the storage-holding means AM2 has already had the memory error of $\Delta v$ at the time $t_2$. As clarified from the above, the memory error based on the above factor will increase in proportion to the smaller discharge time constant $\tau d_1$ of the first stage storage-holding means, the larger charge time constant $\tau c_2$ of the second stage storage-holding means AM2, and the larger pulse magnitude $v_{in}$ of input pulse signal $V_{in}$. Here, it is to be noted that the charging and discharging speeds at the respective storage-holding means are not independently decidable, but generally have a converse relationship with each other.

Figure 5:
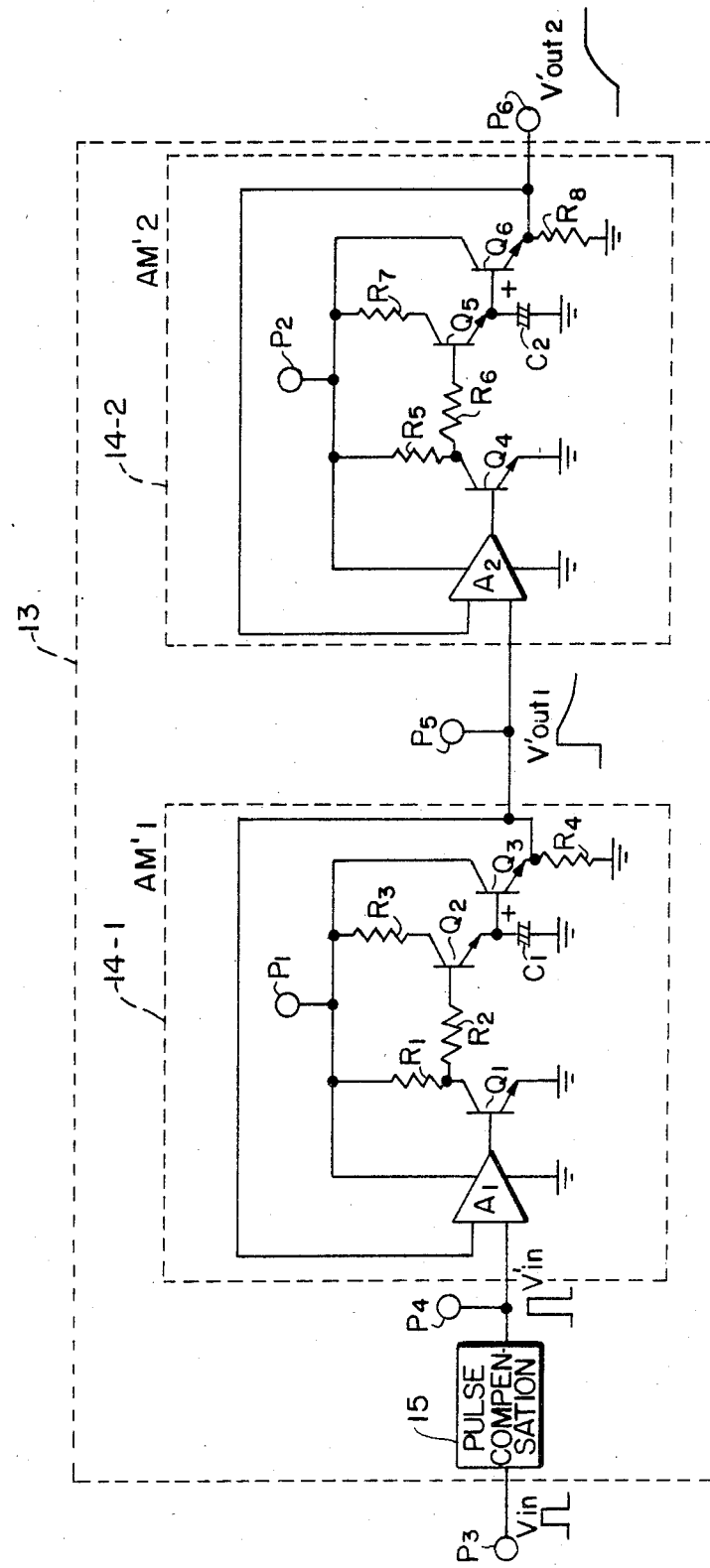
FIG. 5 is a circuit diagram of a second embodiment of the invention.
Figure 6:
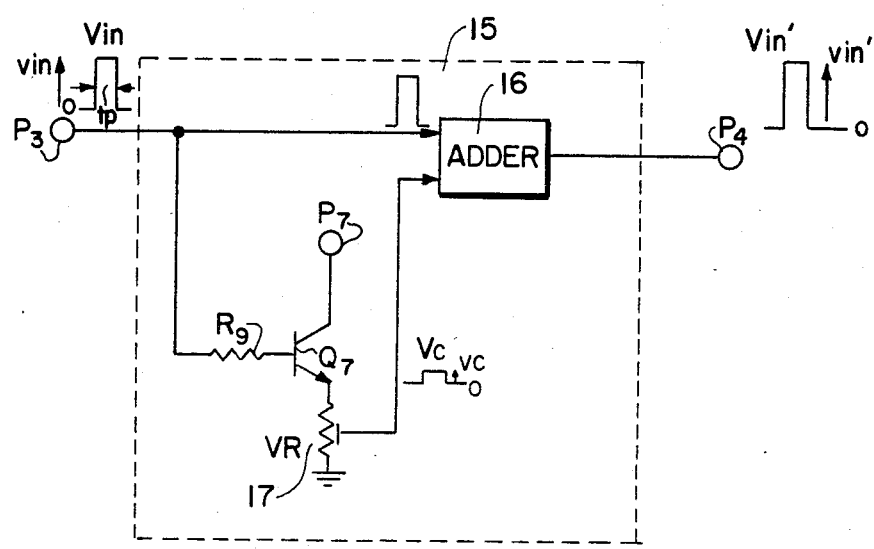
FIG. 6 is a circuit diagram exemplary of a pulse compensation means in the second embodiment.
Figure 7:
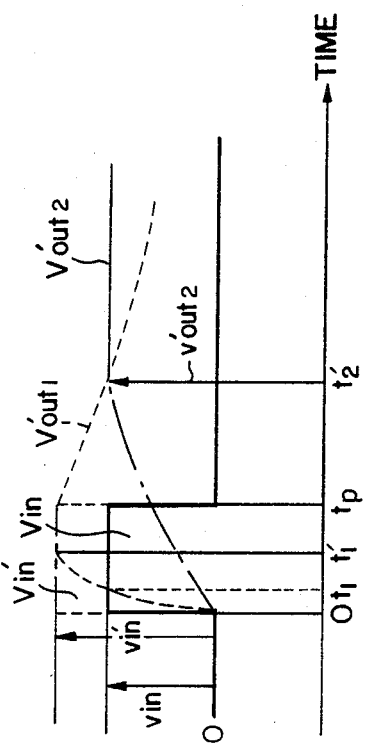
FIG. 7 is a schematic view explanatory of the function of the second embodiment.

FIG. 5 is a circuit diagram of a second embodiment of a pulse amplitude holding apparatus of the present invention, which is capable of compensating for the above memory error and comprises two storage-holding means constituted of operational amplifiers and transistors and the like, and a pulse compensation means 15, the first and second storage-holding means comprising two peak-hold circuits AM'1 (14-1) and AM'2 (14-2) of the same circuitry and of different circuit constants. The peak-hold circuits AM'1 (14-1) and AM'2 (14-2) are energized by a supply voltage (voltage value Vcc) (not shown) through terminals P1 and P2. The first peak-hold circuit AM'1 (14-1) is a modified voltage-follower circuit comprising an operational amplifier A1, transistors Q1, Q2 and Q3, resistances R1, R2, R3 and R4, and a storage capacitor C1, so that the charging speed with respect to its input pulse signal depends upon the capacitance value of the storage capacitor C1, the supply voltage value Vcc, the resistance value of R3, and a current-drive capacity of transistor Q2, and the discharging speed at time constant $t'd_1$ of storage output $V'_{out1}$ of the circuit depends upon the value of the storage capacitor C1, the value of the resistance R4, and the current amplification factor hFE3 of transistor Q3 ($\tau'd_1 \approx hFE3 \cdot R4 \cdot C1$). Similarly, the second peak-hold circuit AM'2 (14-2) comprises an operational amplifier A2, transistors Q4, Q5, Q6, resistances R5, R6, R7 and R8, and a storage capacitor C2, so that the charging speed to the storage output $V'_{out1}$ of the first peak-hold circuit AM'1 by its input signal depends on the capacitance value of storage capacitor C2, supply voltage Vcc, resistance value R7, and current-drive capacity of transistor Q5, and the discharging speed (at the time constant $\tau'd_2$) of storage output $V'_{out2}$ of the circuit depends on a storage capacitor C2, a resistance R8, and a current amplification factor hFE6 of transistor Q6 ($\tau'd_2 \approx hFE6 \cdot R8 \cdot C2$). The pulse compensation means 15 generates a compensation signal which has a constant pulse magnitude decided on a basis of the pulse magnitude of pulse signal $V_{in}$ having the amplitude to be stored, the compensation pulse signal being added to the pulse signal $V_{in}$ to compensate the pulse magnitude, thereby outputting a pulse signal which has been compensated for with respect to its pulse magnitude (to be hereinafter called the compensated pulse signal). FIG. 6 shows an embodiment of the pulse compensation means, and FIG. 7 shows the timing relationship between the output signals of the pulse compensation means 15 and first and second peak-hold circuits AM'1 (14-1) and AM'2 (14-2). Next, explanation will be given on the second embodiment of the pulse amplitude holding apparatus of the invention according to FIG. 5 through 7. The input pulse signal $V_{in}$ of the rectangular wave form of the magnitude $v_{in}$ and pulse width tp is fed to the pulse compensation means 15 at the time 0, and is divided into two pulses which are quite the same in waveform, one of which is fed directly to one input terminal of an adder 16 and the other is fed through a resistance R9 to an emitter follower comprising the transistor Q7, and a potentiometer VR17, and converted by the emitter follower into a compensation signal Vc of rectangular waveform of the amplitude vc (vc<$v_{in}$) and then fed to the input terminal of adder 16, the emitter follower performs the switching operation in accordance with the rectangular waveform input pulse signal, so that, when the rectangular waveform input pulse is absent, the transistor Q7 is inactive to make the emitter's output value approximately zero, thereby causing no variation in the DC level. The adder 16 adds the rectangular waveform input pulse signal $V_{in}$ of pulse magnitude $v_{in}$ to the compensation pulse signal Vc of pulse amplitude vc ($v'_{in} = v_{in} + Vc$) so as to thereby output to the terminal P4 the compensated pulse signal $V'_{in}$. The first peak-hold circuit AM'1 (14-1), when fed the compensated signal at the time 0, starts to charge the storage capacitor C1, the charge magnitude reaching the pulse magnitude $V_{in}$ of the compensated pulse signal $V'_{in}$ at the time $t'_1$ (where $t_1 < t'_1 < tp$); and, after the time tp, a first storage output $V'_{out1}$, which is decreasing due to the discharging of the capacitor with a discharge time constant $\tau d'_1$, is output. The second peak-hold circuit AM'2 (14-2), when the first storage output $V'_{out1}$ is fed thereto, immediately starts to charge the storage capacitor C2, the charge reaching the voltage value of the first storage output $V'_{out1}$, and thereafter, while the charge operation is continued at the discharge time constant $\tau'd_2$ (set to $\tau'd_2 >> \tau'd_1$), the second storage output $V'_{out2}$ which holds the voltage value $v'_{out2}$ of the first storage output $V'_{out1}$ at the time $t'_2$, is fed to the terminal P6. The variable resistance VR for deciding a compensation amount of pulse compensation means 15 is adjusted so as to enable the voltage value $v'_{out2}$ of the first storage output $V'_{out1}$ at the time $t'_2$ to approximately coincide with the pulse magnitude $v_{in}$ of the input pulse.

As seen from the above, the second embodiment uses the pulse compensation means to compensate the pulse magnitude of input pulse of pulse amplitude holding apparatus by a suitable value so as to thereby provide a pulse amplitude holding apparatus which is simple in construction and superior in its storage-holding accuracy.

Figure 9:
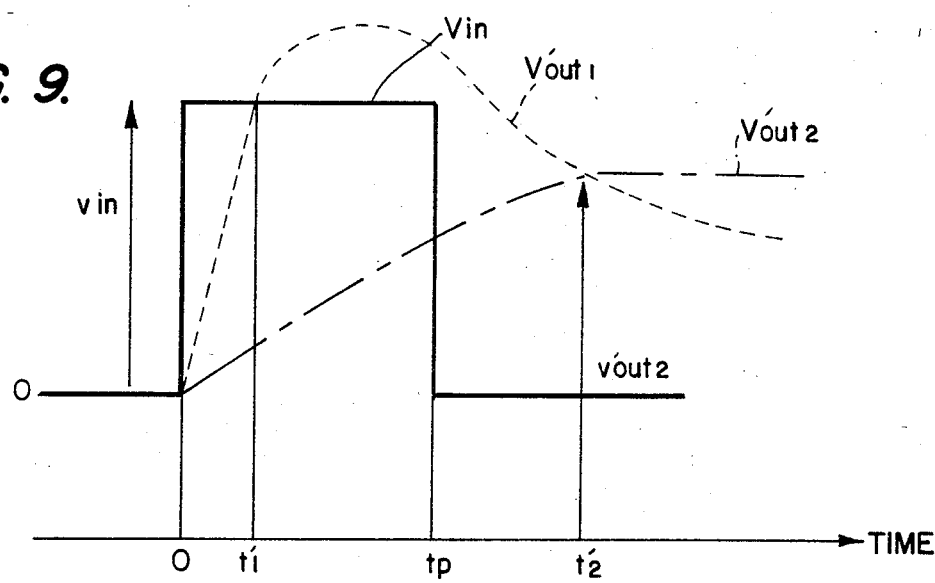
FIGS. 9–9A are views explanatory of the function of the third embodiment.
Figure 9A:
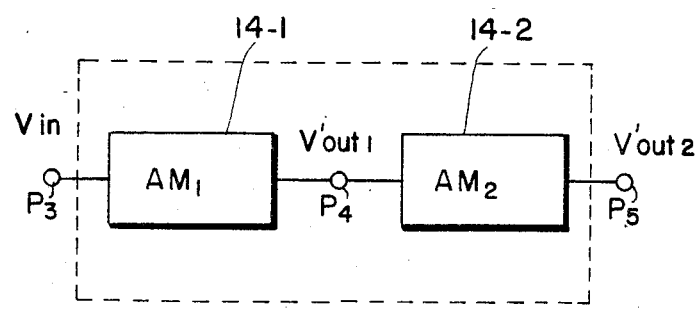
Figure 8:
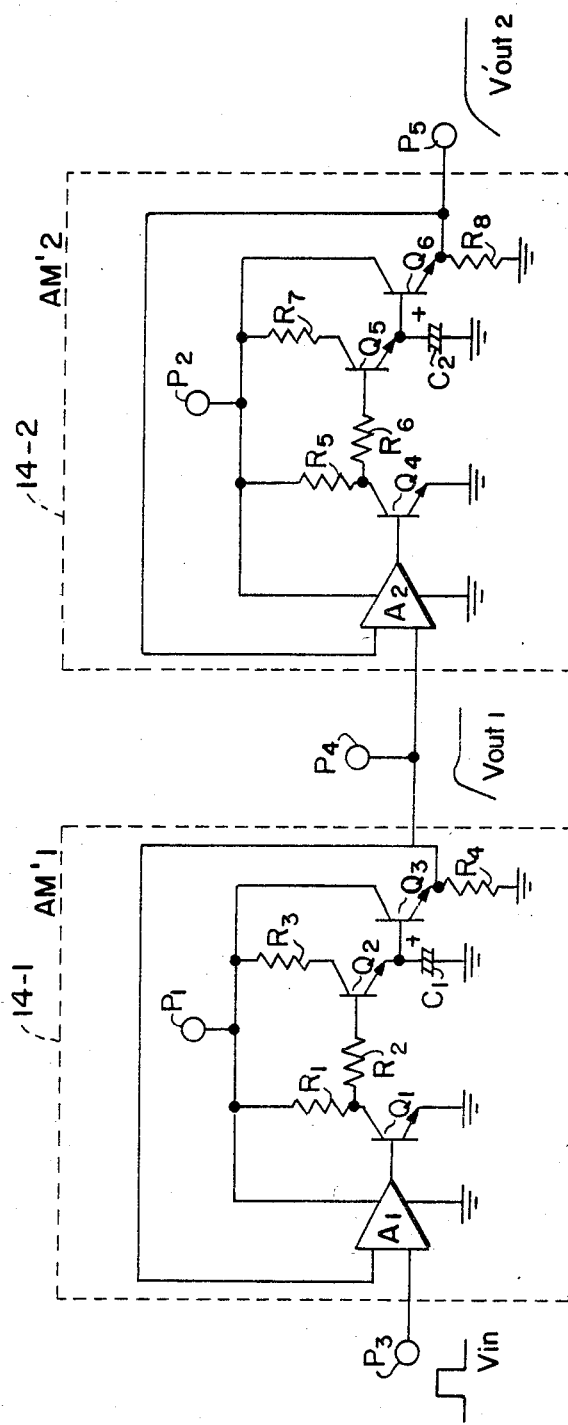
FIG. 8 is a circuit diagram of a third embodiment of the invention.

FIG. 8 is a circuit diagram of a third embodiment of the invention, which is almost the same in function and basic construction as the second embodiment, but has no pulse compensation means thereat, and instead, an operational amplifier A1, having the characteristic such that it overshoots by itself in response to a pulse input is selectively used, so that a response output accompanied by overshoot of a fixed amount with respect to the input pulse signal is output the operation of third embodiment will be described in FIGS. 9–9A. Upon feeding to a terminal P3 a pulse of rectangular waveform of pulse magnitude $v_{in}$ and pulse width tp at the time 0 as shown in FIG. 9, the first peak hold circuit AM'1 (14-1) starts to charge a storage capacitor C1 and indicates a peak value over the pulse magnitude $v_{in}$ of input pulse due to the aforesaid overshoot characteristic, and then outputs the storage output $V'_{out1}$ discharging at the predetermined time constant $\tau'd_1$. The second peak hold circuit AM'2, when the storage output $V'_{out1}$ is fed thereto, immediately starts to charge a storage capacitor C2 and outputs from a terminal P5 a storage output $V'_{out2}$ which reaches the voltage value of the storage output $V'_{out1}$ and thereafter, while discharging at the discharge constant $\tau'd_2$ (set as $\tau'd_2 >> \tau'd_1$), holds the voltage value $v'_{out2}$ of the storage output $V'_{out1}$ at the time $t'_2$. The dischaspeed of first peak hold circuit and the charge speed of second peak hold circuit, when given the circuit constants, are essentially determined. Hence, when the operational amplifier A1 is given its characteristic of the constant overshoot, the pulse magnitude $v'_{out2}$ of storage output $V'_{out1}$ at the time $t'_2$ can be set to be about equal to the pulse magnitude $v_{in}$ of input pulse.

As seen from the above, the third embodiment allows the overshoot of a fixed amount to accompany the pulse response by the operational amplifier forming the first peak hold circuit, thereby providing a pulse amplitude holding apparatus which is simple in construction and superior in its storage-holding accuracy. Alternatively, the storage-holding means accompanied with the constant overshoot may be constructed by inserting, for example, a peaking coil or the like just before the input terminal at the operational amplifier A1 in FIG. 9A so that the input pulse signal itself, after converted into the waveform accompanied by the overshoot, is stored and held. In this case, assuming that the peaking coil is one component of the first storage-holding means, such storage-holding means is deemed to provide the function about equal to that of storage-holding means of the third embodiment, where the operational amplifier constituting the first storage-holding means of course does not respond to the pulse accompanied with the overshoot.

Thus, the second and third embodiments can provide the pulse amplitude holding apparatus which holds, for example, the pulse of rectangular waveform of pulse magnitude of 500 mV and pulse width of 50 μs with an error which ranges from +0 mV to −50 mV for about 10 sec.

As seen from the above, the pulse signal amplitude storage-holding apparatus of the present invention is so constructed that a plurality of storage-holding means for storage-holding the pulse magnitude of the input signal by the use of capacitors are connected in series and at least one pulse compensating means is provided to compensate the pulse magnitude of input pulse, or at least one storage-holding means is allowed to respond to the pulse accompanied by a constant overshoot, thereby making it possible to fabricate a pulse amplitude storage-holding apparatus which is simple in construction, of high accuracy, and extremely effective in practical use.

Although several embodiments have been described, they are merely exemplary of the invention and not to be construed as limiting, the invention being defined solely by the appended claims.

What is claimed is:

1. A pulse signal amplitude storage-holding apparatus comprising a plurality of series connected storage-holding means for storing and holding a pulse magnitude of an electrical pulse signal so that a holding time for said pulse magnitude of said electrical pulse signal is successively extended to thereby store said pulse magnitude of said electrical pulse signal in a sufficiently short time in comparison with a pulse width of said electrical pulse signal, wherein each of said plurality of storage-holding means comprises: an operational amplifier having both first and second input terminals and an output terminal, said amplifier being supplied with an input signal at its second input terminal; a capacitor; a charging means for charging said capacitor according to an output signal from said output terminal of said operational amplifier; and a discharging means for discharging said capacitor, an output signal of said discharging means being supplied to said first input terminal of said operational amplifier and also outputted as an output signal of said storage-holding means.

2. An apparatus according to claim 1, wherein said charging means comprises a first transistor having a base terminal which is connected to said output terminal of said operational amplifier and having an emitter terminal which is connected to a ground, and a second transistor having a base terminal which is connected to a collector terminal of said first transistor and having an emitter terminal which is connected to ground, through said capacitor.

3. An apparatus according to claim 2, wherein said discharging means comprises a third transistor having a base terminal which is connected to said emitter terminal of said second transistor and having an emitter terminal which is connected to ground through a resistor and is connected to said first input terminal of said operational amplifier.

4. A pulse signal amplitude storage-holding apparatus comprising a plurality of series connected storage-holding means for storing and holding a pulse magnitude of an electrical pulse signal so that a holding time for said pulse magnitude of said electrical pulse signal is successively extended to thereby store said pulse magnitude of said electric pulse signal in a sufficiently short time in comparison with a pulse width of said electrical pulse signal, wherein each of said plurality of storage-holding means comprises: an operation amplifier having both first and second input terminals and an output terminal, said amplifier being supplied with an input signal at its second input terminal; a first NPN transistor having a base terminal which is connected to said output terminal of said operational amplifier and having an emitter terminal which is connected to ground, and having a collector terminal which is connected to a power source through a resistor; a second NPN transistor having a base terminal which is connected to said collector terminal of said first NPN transistor and having an emitter terminal which is connected to ground through a capacitor and having a collector terminal which is connected to said power source; and a third NPN transistor having a base terminal which is connected to said emitter terminal of said second NPN transistor and having an emitter terminal which is connected to ground through a resistor and having a collector terminal which is connected to said power source; said emitter terminal of said third NPN transistor being also connected to said first input terminal of said operational amplifier.

* * * * *